United States Patent [19]
Kuisma

[11] Patent Number: 5,091,919
[45] Date of Patent: Feb. 25, 1992

[54] TRANSMITTER ARRANGEMENT FOR DIGITALLY MODULATED SIGNALS

[75] Inventor: Erkki Kuisma, Salo, Finland
[73] Assignee: Nokia-Mobira Oy, Salo, Finland
[21] Appl. No.: 308,245
[22] Filed: Feb. 8, 1989
[51] Int. Cl.$^5$ ............................................. H04L 25/03
[52] U.S. Cl. ...................................... 375/60; 455/126; 330/149; 332/160
[58] Field of Search .................... 375/59, 60; 455/108, 455/126, 63, 263; 330/149; 332/160

[56] References Cited
U.S. PATENT DOCUMENTS

| | | | |
|---|---|---|---|
| 2,705,775 | 4/1955 | Crosby | 332/160 |
| 3,900,823 | 8/1975 | Sokal et al. | 455/126 |
| 4,013,961 | 3/1977 | Colebourn | 455/126 |
| 4,276,514 | 6/1981 | Huang | 330/149 |
| 4,291,277 | 9/1981 | Davis et al. | 375/60 |
| 4,412,337 | 10/1983 | Bickley et al. | 375/60 |
| 4,462,001 | 7/1984 | Girard | 330/149 |
| 4,564,816 | 1/1986 | Kumar et al. | 330/295 |
| 4,592,073 | 5/1986 | Watanabe | 375/60 |
| 4,700,151 | 10/1987 | Nagata | 330/149 |
| 4,706,262 | 11/1987 | Ohta | 375/60 |
| 4,710,815 | 12/1987 | Douglas et al. | 455/108 |
| 4,819,268 | 4/1989 | Kahn | 455/126 |

*Primary Examiner*—Stephen Chin
*Attorney, Agent, or Firm*—Darby & Darby

[57] ABSTRACT

A radio transmitter arrangement for e.g. QAM signals comprising a class C output transistor amplifier (AMP). The control voltage generator (CVG) comprises a memory, whereby the I,Q-signals (I,Q) of the modulating signal (DM) address the control voltage generator (GEN), the information of which is used as a control signal (CS) acting as the collector voltage to control the amplifier output level (RF). The information can be modified to compensate for temperature variations and other non-linearities.

9 Claims, 1 Drawing Sheet

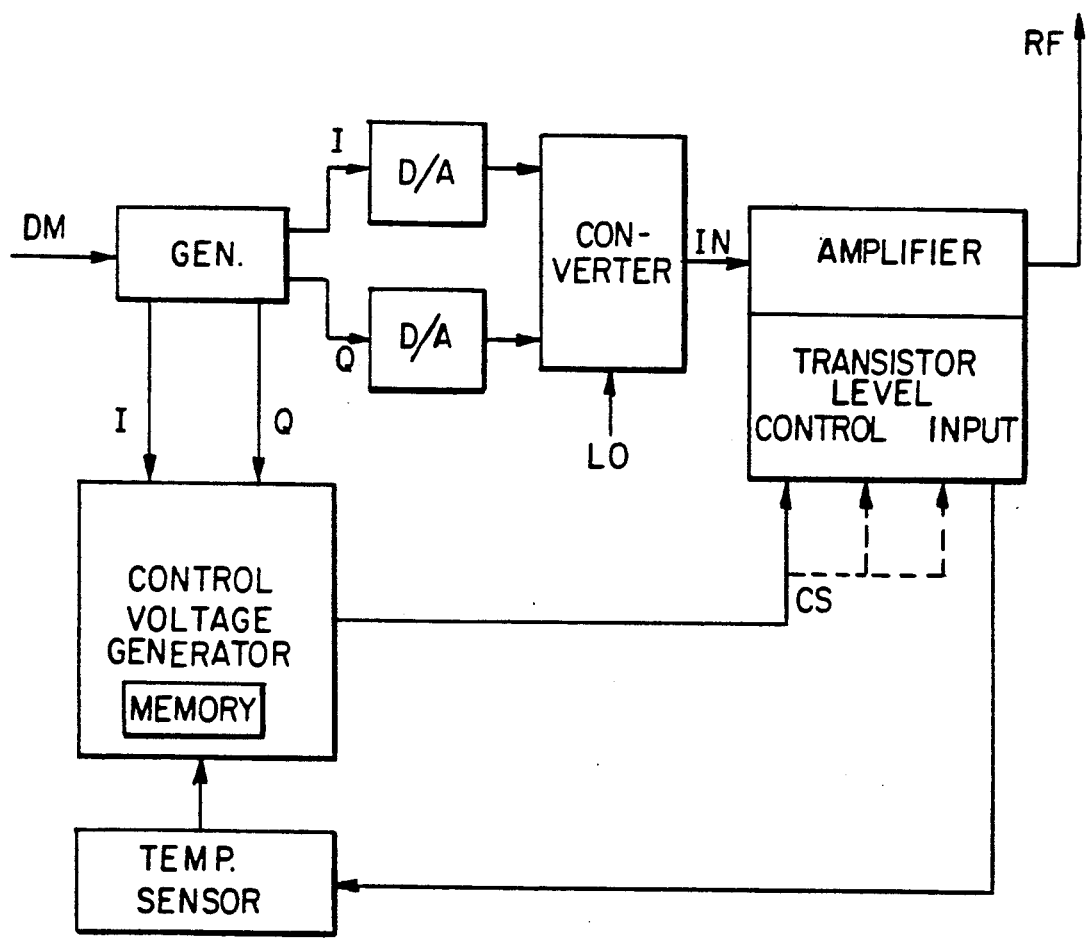

TRANSMITTER ARRANGEMENT FOR DIGITALLY MODULATED SIGNALS

BACKGROUND OF THE INVENTION

1. Field of the Invention

The invention relates to a transmitter arrangement for digitally modulated signals, and especially in a transmitter arrangement, whereby the modulation is a non-constant envelope modulation and the transmitter arrangement comprises a non-linear class C output amplifier and a control voltage generator.

2. Description of the Prior Art

In digital radio systems that do not use constant envelope modulation, the radio transmitter usually comprises linear class A or AB, in some instances linearized class C amplifiers. Such modulation schemes include e.g. schemes of the QAM-type (Quadrature Amplitude Modulation), where the modulated information exists both in the signal phase and in the signal amplitude. A modulation scheme of this kind has been proposed to be used in the future North-American digital mobile radio-telephone system.

Linear amplifiers have a poor efficiency compared to a non-linear amplifier operating in class C. On the other hand, linearized class C amplifiers generally lead to complicated designs.

SUMMARY OF THE INVENTION

It is an object of the present invention to provide a transmitter arrangement with features that overcome the drawbacks of the prior art, and provides some kind of a linearization, especially in such radio systems where the requirements on on linearity are not too stringent. This is the case for a subscriber set in the above mentioned digital mobile radio-telephone system. A not too stringent requirement on linearity means in this case an intermodulation distortion of the order of $-30$ dB.

According to the invention the transmitter arrangement is provided with an amplifier wherein the output level is controlled by the output signal of the control voltage generator. In a preferred embodiment of the transmitter arrangement the amplifier comprises a transistor amplifier and the output signal of the control voltage generator is the collector voltage of the amplifier.

In digital modulation the modulating signal is used to create I,Q -waveforms (In-phase, Quadrature; i.e. two signals of which one has the same phase as the modulating signal and the second is 90 degrees phase shifted). The I,Q -waveforms are multiplied with the sin and cos -waveforms of a signal that has a frequency equalling, e.g., the transmission frequency. The resulting signal is a modulated signal, e.g. the radio frequency transmission signal.

Advantageously the controlling output signal of the control voltage generator is generated from the I,Q-signals in the modulator in correspondence with the actual input signal, and suitably the control signal is modified by information stored in a look-up table in the control voltage generator, to compensate for non-linearities in the control part of the amplifier.

The transmitter arrangement advantageously further comprises a temperature sensor measuring the amplifier temperature, whereby the output of the sensor is connected to the control voltage generator to continuously modify the controlling output signal in accordance with a temperature compensation algorithm stored in the control voltage generator.

BRIEF DESCRIPTION OF THE DRAWINGS

The invention is further described by way of example with reference to the accompanying drawing, in which the only figure is a block diagram showing the main parts of the inventive transmitter arrangement.

DETAILED DESCRIPTION OF THE PREFERRED EMBODIMENTS

In the block diagram of FIG. 1 the modulating signal DM (digital modulating signal input) is connected to the input of the I,Q-generator GEN. The outputs I and Q of the generator GEN carry an in-phase signal I and a 90 degrees phase-shifted signal Q, respectively. In the main signal stream the signals I, Q are connected to the input of the digital to analog converters D/A, which operate at a sampling frequency e.g. four times the bit rate of the input binary signal DM. The analog output signals from the digital to analog converters D/A are connected to the inputs of the up-converter, which is supplied with a modulation frequency signal LO. The output from the up-converter is connected to the radio frequency input IN of the amplifier AMP. The amplifier AMP is a transistor amplifier operating in class C. The radio frequency output signal RF from the amplifier AMP is connected to the antenna of the transmitter arrangement. The amplifier AMP comprises one or more stages, as is indicated by the dashed lines, supplying the control signal CS to three different amplifier stages.

The I,Q-signals are branched from the main signal stream and connected to the inputs of the control voltage generator. The I,Q -signals address a control word, and are then supplied as a control signal CS to the transmitter amplifier AMP. The control signal CS is supplied to the amplifier AMP as the supply voltage, i.e. the collector voltage.

The operation of the transmitter arrangement can be described by signal equations. In the following it is assumed that the level of the output signal RF from the transmitter amplifier AMP has a linear relation to the control signal CS, omitting any compensations. We then have the interdependence:

$I = a(t) \cdot \sin F(t)$, $Q = b(t) \cdot \cos F(t)$, $LO = \cos Wot$, $IN = c(t) \cdot \cos [Wot + F(t)]$, $RF = K \cdot c(t) \cdot \cos [Wot + F(t)]$, and $CS = f[c(t)] + \text{correction}$.

i.e. CS is a signal containing a part, which depends on c(t), and a compensating part.

In the above case the control signal CS is given a value, according to the information stored in the control voltage generator GEN and selected by the respective I,Q -signals.

The information in the control voltage generator GEN can be modified to compensate for the non-linearities in the control part of the amplifier. The values to be put in the cells are then calculated according to the above equations and modified with results from actual measurements. This is the case for temperature compensation as well.

The temperature compensation of the amplifier requires a temperature sensor connected to the amplifier AMP.

The output of the sensor is connected to an input of the control voltage generator, which in this case includes a set of cells with information containing correction values. The sensor signal addresses a correction value, which is added to the cell values for the I,Q -signals, in accordance with an algorithm stored in the memory.

The information contents of the control voltage generator is preferably programmed (stored) during the final production tests of the transmitter arrangement equipment, when the individual variations in the amplifier characteristics, such as non-linearities and temperature dependency, can be accurately measured.

Applications of the principles of the invention in this and similar manners are all intended to fall within the scope of the invention.

What is claimed is:

1. A transmitter arrangement for non-constant envelope, digitally modulated signals, comprising:
    a non-linear output amplifier having inputs for receiving an input signal and a control signal, respectively, and an output for delivering an output signal responsive to said input and control signals;
    a control voltage generator having an input for receiving the input signal and having stored predetermined information concerning non-linearity of the output amplifier, said control voltage generator providing the control signals to the non-linear output amplifier, the control signals being based upon the value of said input signal and the predetermined information, such that the control signal renders the output signal of said output amplifier substantially linear in relation to the input signal over a range of operation.

2. The transmitter arrangement of claim 1, wherein said predetermined information is free of any direct relation to said output signal.

3. A transmitter arrangement as claimed in claim 1 wherein the output amplifier is a Class C output amplifier.

4. A transmitter arrangement as claimed in claim 3 wherein said class-C output amplifier is a transistor amplifier and the control signal is applied through the level control input to the collector of at least one transistor of the transistor amplifier.

5. A transmitter arrangement as claimed in claims 1 or 3 further including a first converter means for changing the form of the input signal prior to its application to the control voltage generator to a quadrature amplitude modulation signal having an in-phase portion and a quadrature phase portion, said in-phase portion and quadrature phase portion being applied to said control voltage generator.

6. A transmitter arrangement as claimed claims 1 or 3 wherein the predetermined information concerning non-linearity is stored in said control voltage generator.

7. A transmitter arrangement as claimed claim 5 wherein the predetermined information concerning non-linearity is stored in a memory within said control voltage generator, said memory having a plurality of locations and the in-phase portion and quadrature phase portion uniquely identify a location in said memory where information is stored to compensate for a non-linearity in the output amplifier at an input signal level corresponding to the in-phase and quadrature phase portion.

8. A transmitter as claimed in 5 further includes two digital-to-analog converters for converting the in-phase portion with the quadrature phase portion into respective analog signals, a second converter for changing the respective analog signals into a converter output signal applied to the input of the output amplifier, said second converter being an up-converter supplied with a modulation frequency signal for frequency modulating the analog signals up to the modulation frequency and combining them.

9. A transmitter arrangement as claimed in claims 1 or 3 further including a temperature sensing means for measuring the output amplifier temperature and creating a temperature signal applied to the control voltage generator, the control voltage generator further including a predetermined temperature information concerning the output amplifier, said predetermined temperature information also modifying the control signal in response to the temperature signal such that the output of the output amplifier is compensated for its non-linearity and temperature.

* * * * *